United States Patent [19]

Aldridge et al.

[11] Patent Number: 5,548,463
[45] Date of Patent: Aug. 20, 1996

[54] SYSTEM FOR SWITCHING POWER AND SCRUBBING POWER MIXING DEVICES FOR FAULTS

[75] Inventors: David L. Aldridge, Dripping Springs; William P. Bunton, Pflugerville; Stephen R. Bissell, Austin; David Brown, Austin; Daniel D. Gunn, Austin; Carl Kagy, Cedar Park; David P. Sonnier, Austin, all of Tex.

[73] Assignee: Tandem Computers Incorporated, Cupertino, Calif.

[21] Appl. No.: 578,883

[22] Filed: Jan. 11, 1996

Related U.S. Application Data

[63] Continuation of Ser. No. 268,699, Jun. 30, 1994, abandoned.

[51] Int. Cl.[6] .................... H02H 7/00; G01R 31/26
[52] U.S. Cl. .................. 361/18; 323/272; 363/15; 363/65; 363/89; 324/523; 324/765
[58] Field of Search ................... 323/269, 272; 307/43, 48; 361/18; 363/13–15, 34, 65, 89; 324/500, 522, 523, 537, 765, 767–769, 527

[56] References Cited

U.S. PATENT DOCUMENTS

| | | | |
|---|---|---|---|
| 4,181,842 | 1/1980 | Elias et al. ........................ | 307/66 |
| 5,019,717 | 5/1991 | McCurry et al. .................. | 307/66 |
| 5,216,286 | 6/1993 | Peterson .......................... | 307/64 |
| 5,325,062 | 6/1994 | Bachand et al. .................. | 324/537 |

Primary Examiner—Jeffrey A. Gaffin
Assistant Examiner—Michael J. Sherry
Attorney, Agent, or Firm—Townsend and Townsend and Crew LLP

[57] ABSTRACT

A power switching circuit module includes two power rails coupling independent power supplies to the input of a DC controller and test circuits to detect latent faults in power mixing devices included in the circuit.

4 Claims, 2 Drawing Sheets

SYSTEM FOR SWITCHING POWER AND SCRUBBING POWER MIXING DEVICES FOR FAULTS

This is a Continuation of application Ser. No. 0/268,699, filed Jun. 30, 1994, now abandoned.

BACKGROUND OF THE INVENTION

1. Field of the Invention

The present invention relates generally to testing devices for faults.

2. Description of the Related Art

Many digital systems often utilize redundancy as one mechanism of achieving fault tolerance. As an example, a DC controller (DCC) can be coupled to two independent power sources to operate in a fault tolerant manner. The coupling of the independent power sources to the DCC is accomplished utilizing power mixing component such as transistors, fuses, and isolation diodes.

It is possible for the DCC to operate properly even if one or more of the power mixing components has a latent open circuit of short circuit fault. However, in the event that one of the power supplies fails to produce power or experiences a short circuit to ground a latent fault in a power mixing device could cause failure of the system.

Thus, typically such latent faults are not discovered until the actual failure of the system.

SUMMARY OF THE INVENTION

The present invention is a system for testing for latent faults in power mixing devices coupling two independent power sources to a DC controller. According to one aspect of the invention, a circuit module includes first and second power rails and power mixing devices for coupling, respectively, first and second power sources to the inputs of a DC controller.

According to a further aspect of the invention, a latent short circuit fault in a power mixing device is detected by momentarily turning off power on a first rail and monitoring a test node on the first rail between the power supply and the power mixing device to detect a momentary return to ground at the test node on the first rail.

According to a still further aspect of the invention, an open circuit in a power mixing device in a first rail is detected by turning of a second rail and detecting a power failure in the circuit module.

Other features and advantages of the invention will become apparent in view of the following detailed description and appended drawings.

DESCRIPTION OF THE PREFERRED EMBODIMENT

Figure 1:
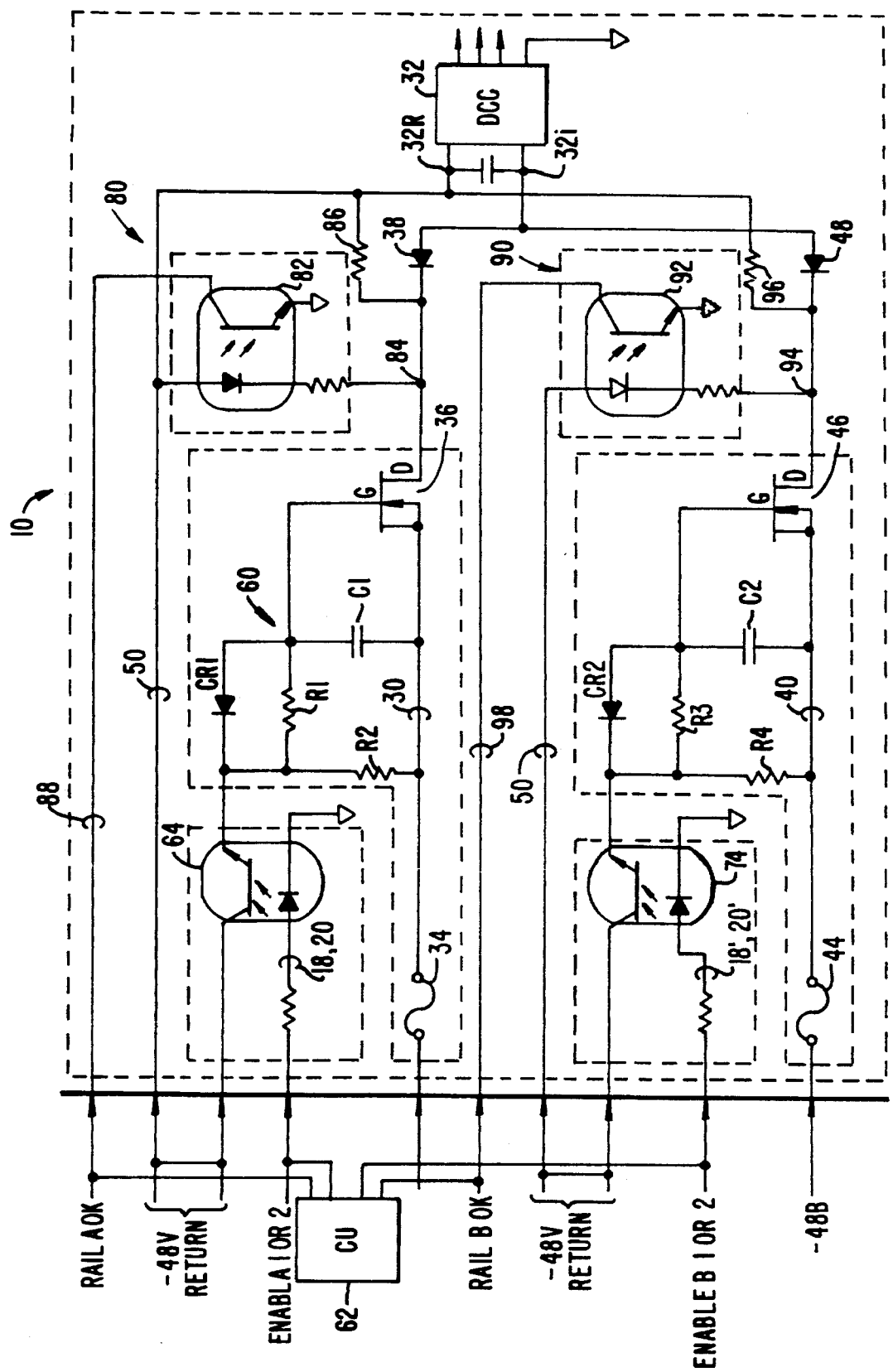
FIG. 1 is a schematic diagram of a preferred embodiment of the invention.

FIG. 1 is a schematic diagram of a preferred embodiment of the invention. In FIG. 1 a power circuit 10 includes two power rails, −48VA and −48VB, which are coupled to independent power sources (not shown). In a preferred embodiment the two power rails share a common return path called −48 V return. Accordingly, all potentials are negative with respect to −48 V return.

The circuit 10 includes a first power rail 30 which is coupled to the input of a DC controller (DCC) 32 through a first fuse 34, a first power pass transistor 36, and a first isolation diode 38 coupled in series. Similarly, a second power rail 40 is coupled to the input of the DCC 32 through a second fuse 44, a second power pass transistor 46, and a second isolation diode 48 coupled in series. The diodes 38 and 48 combine the rails to provide power to the input 32i of the DCC 32. The return terminal 32r of the DCC 32 is coupled to −48 V return 50.

A first power switching circuit 60 is controlled by ENABLE A1 and ENABLE A2 signals provided by a control unit (CU) 62 via first and second ENABLE A lines 18 and 20. The ENABLE signals are logic level signals. The ENABLE signals are coupled to the control diode input of a first switching opto-isolator 64. Resistors R1 and R2, capacitor C1, and diode CR1 form a gate bias circuit for the gate of N-channel MOS transistor 36. This gate bias circuit is coupled between the first power rail 30 and the signal transistor input of the first switching opto-isolator 64.

A second switching control circuit 70 is controlled by ENABLE B1 and ENABLE B2 signals supplied by the control unit 62 via first and second ENABLE B lines 18' and 20' and includes a second control opto-isolator 64 and gate bias circuit formed by resistors R3 and R4, capacitor C2, and diode CR2.

A first test circuit 80 includes a first test opto-isolator 82 having its control input coupled to a first test node 84 located between the drain of the first power pass N-channel MOS transistor 36 and the cathode of the first isolation diode 38. The first test node 84 is coupled to the −48 V return by a first pull-up resistor 86. The signal transistor input of the first test opto-isolator 82 receives a logic level RAILAOK provided by the CU 62 via a RAILAOK line 88.

A second test circuit 90 includes a second test opto-isolator 92 having its control diode input coupled to a second test node 94 located between the drain of the N-channel MOS transistor 46 and the cathode of the second isolation diode 48. The second test node 94 is coupled to the −48 V return by a second pull-up resistor 96. The signal transistor input of the second test opto-isolator 92 receives a logic level RAILBOK provided by the CU 62 via a RAILBOK line 98.

The operation of the power switching circuits 60 and 70 will now be described. If either ENABLE A1 or ENABLE A2 are asserted then current flows through the first gate bias generating circuit via the signal transistor input of the first switching opto-isolator 64 to generate a positive $V_{GS}$ to turn on the first power pass transistor 38 and switch on the first rail 30. The assertion of either ENABLE B1 or ENABLE B2 similarly switches on the second rail 40.

Figure 2:
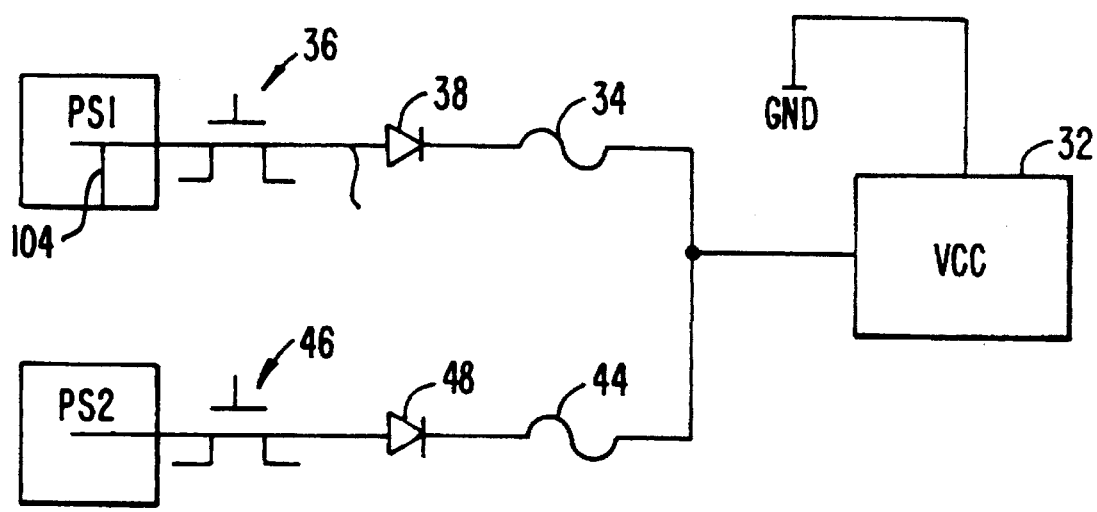
FIG. 2 is a circuit diagram illustrating a possible short circuit fault.

The function of the isolation diodes 38 and 48 will now be described with reference to FIG. 2. In FIG. 2 dark bars 102 and 104 represent short circuits faults. The short circuit fault 104 in the first power supply (PS1) is a short to ground. If the first isolation diode 38 is not shorted then it will prevent current from flowing from PS2 through the PS1 short to ground and prevent damage due to an overcurrent condition. However, if the first isolation diode has a short circuit fault then current flows through both short circuits 102 and 104 and a system wide power outage would occur.

The function of the test circuits 80 and 90 to uncover latent faults in the power mixing elements will now be described with reference to FIG. 1. The CU 62 monitors first and second test nodes 84 and 94 through the RAILAOK and RAILBOK signals, respectively, under all allowable conditions of the four ENABLE signals. When both rails are switched on both RAILOK signals are held low (TRUE) by test opto-isolators 82 and 84, i.e., when the first the power pass transistor 36 is on the first test node 84 is energized and current flows through the control diode input of the first test opto-isolator 82 to turn on the transistor part of the opto-isolator and couple the RAILAOK signal to logic ground.

If the first fuse 34 or power pass transistor 36 are open due to an open circuit fault then the test node 84 will not be energized when either ENABLE A1 or ENABLE A2 is asserted so that the RAILAOK signal will go high (FALSE). Thus, the control circuit 80 detects a latent open circuit when either of the ENABLE A signals is asserted and the monitored RAILOK signal is FALSE.

The first power pass transistor 36 and first isolation diode 38 can be scrubbed for short circuit faults by momentarily negating both ENABLE A signals and asserting either of the ENABLE B signals. In this case, if no devices have faults the first test node 84 is isolated from both power sources because the first power transistor 36 is off and the first isolation diode 38 is reverse biased. The first test node 84 is pulled up to the return voltage by the pull-up resistor 86 which typically has a high value such as 20K.

Accordingly, no current flows through the control diode input of the first test opto-isolator 82 and the RAILOK signal changes momentarily to FALSE. If the CU 62 fails to detect the momentary transition of the RAILAOK signal from TRUE to FALSE then either the first power pass transistor 34 or first isolation diode 36 has a short circuit fault.

A latent open circuit fault in the first isolation diode 38 can be detected by negating both ENABLE B signals and asserting either ENABLE A signal. If the first isolation diode 38 is open due to an open circuit fault then the DCC 32 stops operation because the second rail is switched off and no power can reach its input 32i because the first isolation diode 38 is open.

Accordingly, it is possible to scrub each of the power mixing devices, i.e., fuses, the power pass transistors, and isolation diodes for latent open circuit and short circuit faults.

Further, appropriate isolation of two nominally independent power sources is assured while allowing the DCC 32 to operate off of either/both of the power sources in a fault-tolerant fashion due to the normal isolating characteristics of (scrubbed good) mixing/isolation diodes 38 and 48 and the normal energy limiting characteristics of (scrubbed good) fuses 34 and 44.

The invention has now been described with reference to the preferred embodiments. Alternatives and substitutions will now be apparent to persons of ordinary skill in the art. For example, isolation/mixing devices other than diodes, such as diode connected MOS transistors could be utilized. Additionally, the polarities and voltage levels describe with reference to the preferred embodiments are not required to practice the invention. Accordingly, it is not intended to limit the invention except as provided by the appended claims.

What is claimed is:

1. In a power circuit supplying power from multiple power supplies to device having a power input port, a system for detecting latent faults in power mixing devices comprising:

a first power rail coupling a first power source to the power input port, said first power rail including a first power pass transistor and a first isolation diode coupled in series, and having a first test node between said first power pass transistor and said first isolation diode, with said first isolation diode for coupling said first test node to the power input port of the device and for isolating the first test node from other power sources unless said first isolation diode has a short circuit fault;

a second power rail coupling a second power source to the power input port, said second power rail including a second power pass transistor and a second isolation diode coupled in series, and having a second test node between said second power pass transistor and said second isolation diode, with said second isolation diode for coupling said second test node to the power input port of the device and for isolating the second test node from other power sources unless said second isolation diode has a short circuit fault;

a first switching circuit, coupled to receive a first enable signal and coupled to said first power pass transistor, for turning on said first power pass transistor when said first enable signal is asserted to couple said first power source to said first test node to energize said first test node unless said first power pass transistor has an open circuit fault;

a second switching circuit, coupled to receive a second enable signal and coupled to said second power pass transistor, for turning on said second power pass transistor when said second enable signal is asserted to couple said second power source to said second test node to energize said second test node unless said second power pass transistor has an open circuit fault;

a first test circuit, coupled to said first test node, for asserting a first OK signal if said first test node is energized;

a second test circuit, coupled to said second test node, for asserting a second OK signal if said second test node is energized, where said first OK signal is negated in the case where said first enable signal is asserted and said power pass transistor has an open circuit fault so that a latent open circuit in the first power pass transistor can be detected, and where said first OK signal is asserted in the case where said first enable signal is negated, said second enable signal is asserted and said first isolation diode has a short circuit fault so that said first isolation diode can be scrubbed for faults.

2. The system of claim 1 wherein:

said first test circuit includes an opto-isolator, having a diode control input coupled to said first test node, for asserting said first OK signal when said first test node is energized.

3. The system of claim 1 wherein:

said first power rail further comprises an energy-limiting fuse connected in series between the first power source and said first test node where said first OK signal is negated if said first enable signal is asserted and said fuse has an open circuit fault.

4. The system of claim 1 further comprising:

a control unit, coupled to said first and second switching circuits and said first and second test circuits, for monitoring said OK signals when said enable signals are asserted and negated to scrub said diodes for faults.

* * * * *